(12) United States Patent
Mulatti et al.

(10) Patent No.: US 6,392,936 B1
(45) Date of Patent: May 21, 2002

(54) METHOD AND APPARATUS FOR GENERATING FROM A SINGLE SUPPLY LINE VOLTAGES INTERNAL TO A FLASH MEMORY WITH REDUCED SETTLING TIMES

(75) Inventors: Jacopo Mulatti, Latisana; Marco Maccarrone, Palestro, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/608,239

(22) Filed: Jun. 30, 2000

(30) Foreign Application Priority Data

Jul. 2, 1999 (IT) .......................................... MI99A1475

(51) Int. Cl.[7] .............................................. G11C 13/00
(52) U.S. Cl. .................... 365/189.09; 365/201; 365/203
(58) Field of Search ................................. 365/203, 226, 365/189.09, 201

(56) References Cited

U.S. PATENT DOCUMENTS 5,051,958 A * 9/1991 Arakawa .................... 365/226
5,250,854 A * 10/1993 Lien .......................... 365/201

* cited by examiner

Primary Examiner—Terell W. Fears
(74) Attorney, Agent, or Firm—Robert Iannucci; Lisa K. Jorgenson; Seed IP Law Group PLLC

(57) ABSTRACT

Presented is a memory architecture including at least first, second and third voltage booster circuits adapted to generate, on respective first, second and third circuit nodes, at least first, second and third boosted voltage references. These boosted references are in turn connected to first, second and third adjusters, which are adapted to provide respective first, second and third voltage references as required for the operations of programming, erasing and verifying cells of the memory architecture. At least a first switch block is used that connects between the first and third circuit nodes and is controlled by a first control signal to place the first and third high-voltage references in parallel during cell verify operations, thereby to provide one equivalent high-voltage source having a higher capacity for current than individual sources and effectively speed up the charging of the first circuit node so as to shorten the settling time of the first voltage reference. A method is also presented for generating voltage references with a reduced value of settling time as produced within a memory architecture.

19 Claims, 7 Drawing Sheets

METHOD AND APPARATUS FOR GENERATING FROM A SINGLE SUPPLY LINE VOLTAGES INTERNAL TO A FLASH MEMORY WITH REDUCED SETTLING TIMES

TECHNICAL FIELD

This invention relates to a memory architecture having a reduced value of settling time of its internal voltage references, and to a method of generating voltage references.

BACKGROUND OF THE INVENTION

Flash memory cells are programmed by applying appropriate voltage values to gate and drain terminals of the cells.

As shown in FIG. 1A, a flash type of memory architecture 1 includes a plurality of memory cells laid into a matrix 2. The cell terminals are accessed by a row decoder 3 and a column decoder 4, the latter being controlled by so-called program load devices 5.

In particular, the row decoder 3 is supplied a first voltage reference VPCX directly, which is called row decode reference and obtained through a first adjuster 6 from a first high-voltage reference HV1, as output from a first voltage booster circuit 7 being in particular a charge pump circuit.

Likewise, the column decoder 4 is supplied a second voltage reference VPCY, called column decode reference and obtained through a second adjuster 7 from a second high-voltage reference HV2, as output from a second voltage booster circuit 9 being in particular a charge pump circuit. The program load devices 5 are supplied a program voltage reference VPD, which is obtained, through a third adjuster 10, from a third high-voltage reference HV3 as output from a third voltage booster circuit 11 being in particular a charge pump circuit.

As shown in FIG. 1B, a gate terminal G1 of a selected memory cell 13 is connected to the row decode voltage reference VPCX through the row decoder 3, and the cell drain terminal D1 is connected to the program voltage reference VPD through a series of the column decoder 4 and the program load devices 5.

This program voltage reference VPD is, therefore, to go through three tiers of pass transistors YN, YM and YO contained in the column decoder 4. In order for these pass transistors YN, YM and YO to operate in the triode range, thereby minimizing the voltage drop across them, the column decode voltage reference VPCY is applied to the gate terminals of the pass transistors.

It is known to how obtain these voltage references VPCX, VPCY and VPD from boosted voltage references HV1, HV2 and HV3, by means of the adjusters 6, 8 and 10, which use suitable operational amplifiers, as shown in FIG. 2 for a generic high-voltage reference VPC obtained from a boosted voltage reference HV by means of an operational amplifier 14.

A memory cell programming operation is usually preceded, and followed, respectively by two operations to verify the cell state, also known as the program verify operations. By these verify operations, a check is made of whether the cell requires one or more additional program pulses.

During these verify operations, the value of the row decode reference VPCX is less than that used during the program operations, while the value of the program voltage reference VPD remains substantially constant at about 1 Volt.

FIG. 3 shows plots vs. time of the voltage references VPCX, VPCY and VPD during a program operation.

For the memory cell programming operations, as well as the subsequent verifying operations, to be performed correctly, the high-voltage references VPCX and VPCY are first to attain desired values. This wait or settling time represents a technical loss, in that no operations can be carried out at the cell in the meantime.

Settling time is dependent on a capacitance (of up to 100 pF) associated with the row and column decoders 6 and 8, as well as on the voltage booster devices 7 and 9 providing the boosted voltages HV1 and HV2 (in particular, from their equivalent output resistances, on the order of 10 kΩ). In conventional devices, it may amount to a few microseconds.

Until now, no memory architecture existed with such structural and functional features as to allow settling time to be reduced, and overcome the drawbacks of similar prior devices.

SUMMARY OF THE INVENTION

Principles of embodiments of this invention include having the boosted voltage references paralleled to increase their charge capacity during predetermined operations to be performed at the memory cell. In particular, embodiments of the inventive memory architecture include suitable controlled switches associated with the boosted voltage references.

Based on these principles, embodiments of the invention include a memory architecture which has at least first, second and third voltage booster circuits adapted to generate, on respective first, second and third circuit nodes, at least first, second and third boosted voltage references. These boosted voltage references are in turn connected to first, second and third adjusters adapted to provide respective first, second and third voltage references for the memory architecture. The memory architecture uses these voltage references as required for the operations of programming, erasing and verifying cells of the memory architecture. The boosted reference voltages can be coupled in parallel together by one or more switches during cell verify operations, thereby to provide one equivalent high-voltage source having a higher capacity for current than individual sources and effectively speed up the charging of a first circuit node so as to shorten the settling time of the first voltage reference.

Embodiments of the invention also include a method of generating a plurality of boosted voltage references by means of a plurality of voltage booster circuits; adjusting the plurality of boosted voltage references by means of a plurality of adjusters to provide a plurality of voltage references as required for the operations of programming, erasing and verifying cells of the memory architecture; and paralleling at least first and second high-voltage references during cell verify operations, thereby to provide one equivalent high-voltage source having a higher capacity for current than individual sources and effectively shorten the settling time of at least one in the plurality of voltage references.

The features and advantages of a memory architecture according to the invention will be apparent from the following description of an embodiment thereof, given by way of non-limitative example with reference to the accompanying drawings.

DETAILED DESCRIPTION OF THE INVENTION

Figure 3:
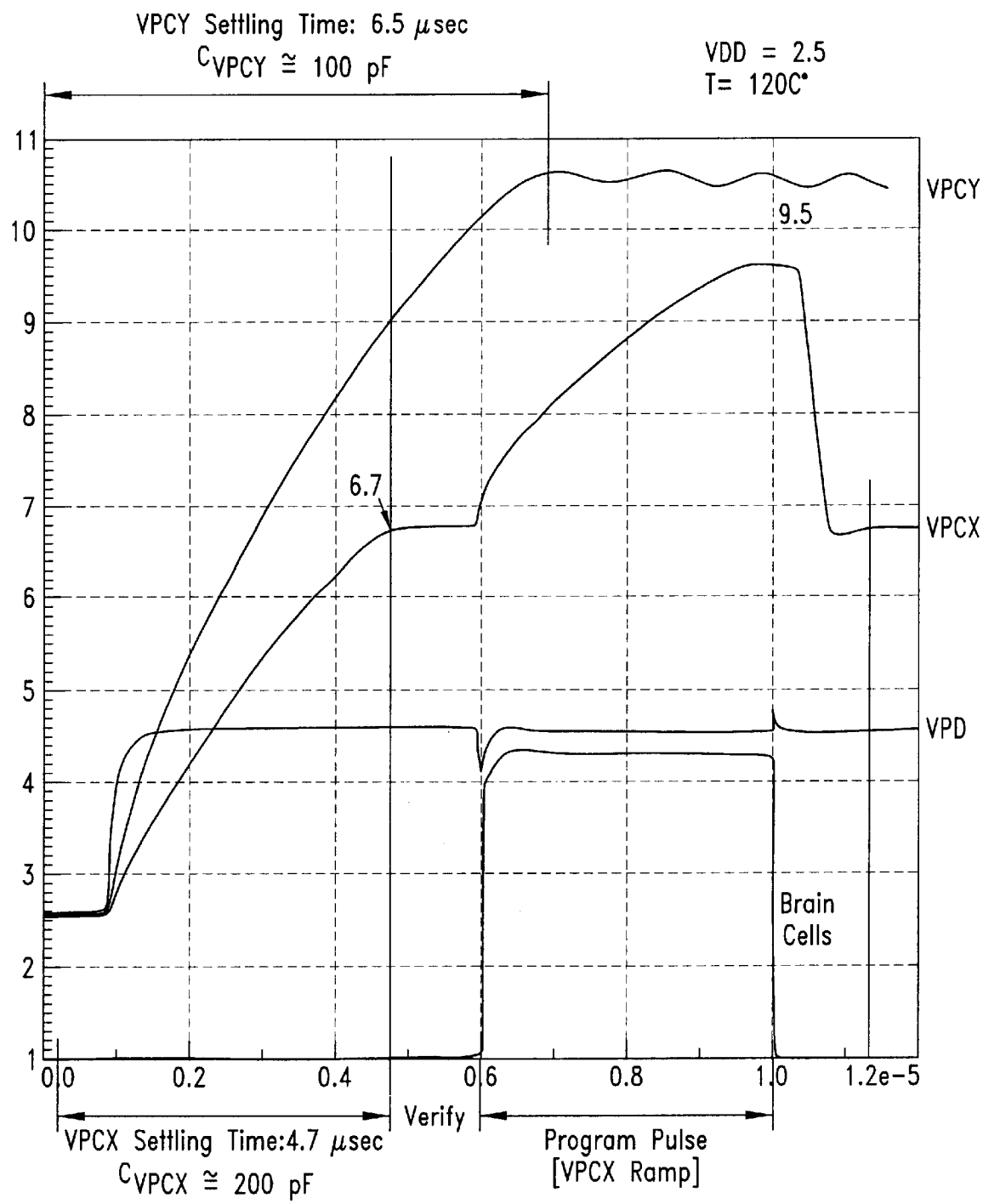
FIG. 3 is a graph that shows qualitative plots of voltage signals present in the memory architecture of FIG. 1 vs. time.

Referring to the voltage patterns shown in FIG. 3, it is observed that the program voltage reference VPD is applied to the drain terminal of a memory cell only during the program pulse proper.

During the settling time of a verify operation carried out before the program operation, the program voltage reference VPD is activated but not passed to the memory cell. During this time lapse, it is a sense amplifier which sets the voltage value at the drain terminal of the cell to be checked for its state, and not the adjuster for the program voltage reference VPD.

Accordingly, the boosted voltage reference HV3, from which the program voltage reference VPD is derived, will not come into play at this verification stage.

The boosted voltage reference HV3, unlike the boosted voltage references HV1 and HV2 from which the row decode references VPCX and VPCY are derived, is usually a high voltage source adapted to supply a current, since it is to provide an anticipated level of the program voltage reference VPD for the program pulse, as well as adapted to supply a large current to the drain terminals of the cells connected to it (a few hundred $\mu$A per cell) in order to allow hot electrons to be injected into the floating gate terminals of the cells.

The memory architecture of embodiments of this invention provides for the boosted voltage reference HV3 to be used as a back-up for the other boosted voltage references HV1 and HV2 during the settling time of the row and column decode references VPCX and VPCY which precede the cell state verify operations.

Figure 4:
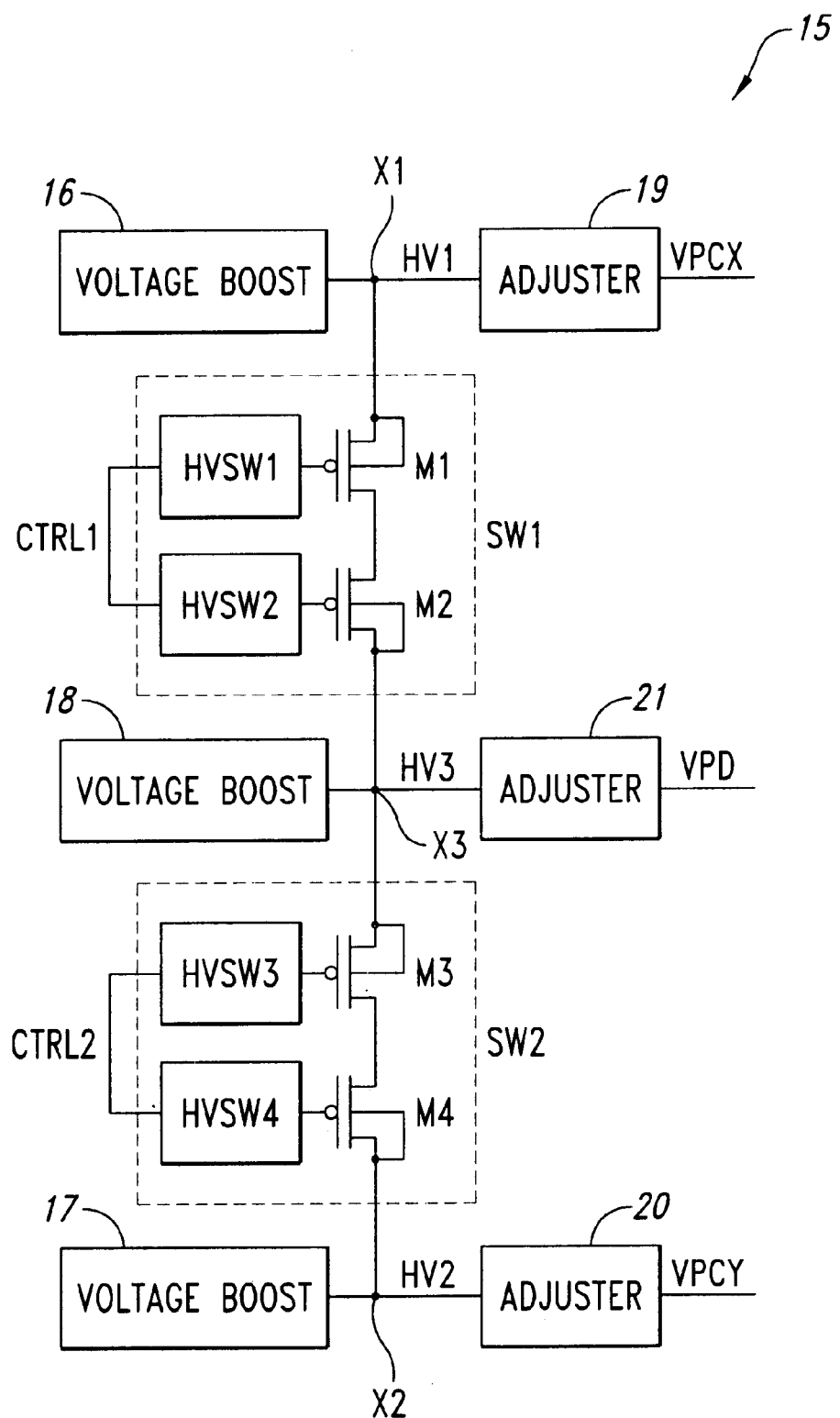
FIG. 4 is a schematic diagram of a memory architecture according to an embodiment of this invention.

FIG. 4 shows a memory architecture 15 according to one embodiment of the invention, especially as regards generating the internal high-voltage references.

The memory architecture 15 includes first 16, second 17 and third 18 voltage booster circuits, specifically charge pump circuits, operative to generate first HV1, second HV2 and third HV3 high-voltage references at first X1, second X2 and third X3 circuit nodes.

The memory architecture 15 also includes a first adjuster 19, connected to the first circuit node X1 and, therefore, to the first high-voltage reference HV1, for generating a row decode reference VPCX; a second adjuster 20, connected to the second circuit node X2 and, therefore, to the second high-voltage reference HV2, for generating a column decode reference VPCY; and a third adjuster 21, connected to the third circuit node X3 and, therefore, to the third high-voltage reference HV3, for generating a program voltage reference VPD.

Advantageously, the memory architecture 15 further includes first SW1 and second SW2 switch blocks. In particular, the first switch block SW1 is coupled between the first circuit node X1 and the third X3, while the second switch block SW2 is connected between the third circuit node X3 and the second X2.

In particular, the first switch block SW1 includes first and second P-channel MOS transistors M1 and M2 which are connected, in series with each other, between the first X1 and third X3 circuit nodes and have their gate terminals respectively connected to first HVSW1 and second HVSW2 high-voltage switches, which are also connected together. In addition, the first high-voltage switch HVSW1 has a control terminal connected to the source terminal of the first transistor M1, and the second high-voltage switch HVSW2 has a control terminal connected to the drain terminal of the second transistor M2.

Likewise, the second switch block SW2 includes first and second P-channel MOS transistors M3 and M4 which are connected, in series with each other, between the third X3 and second X2 circuit nodes, and have their gate terminals respectively connected to first HVSW3 and second HVSW4 high-voltage switches, which are also connected together. In addition, the first high-voltage switch HVSW3 has a control terminal connected to the source terminal of the first transistor M3, and the second high-voltage switch HVSW4 has a control terminal connected to the drain terminal of the second transistor M4.

Finally, the common terminals of the high-voltage switches HVSW1 and HVSW2 in the first switch block SW1, and the common terminals of the high-voltage switches HVSW3 and HVSW4 in the second switch block SW2, receive control signals CTRL1 and CTRL2, respectively.

These control signals CTRL1 and CTRL2 are provided already in conventional memory cell program algorithms, and in particular, are set by a microcontroller of the memory architecture during the program verify operations.

The operation of the memory architecture 15 according to the described embodiment of the invention will now be described.

Using the switch blocks SW1 and SW2, the high-voltage references HV1, HV2 and HV3 are paralleled together during a verify operation, such that one equivalent high-voltage source is provided which has a higher capacity for current than individual sources and allows of faster charging of the circuit nodes X1 and X2, thereby shortening the settling time of the row and column decode references VPCX and VPCY.

In particular, for a single-voltage memory device, the voltage booster circuits 16 and 17 associated with the first and second high-voltage references, HV1 and HV2, basically are single voltage boosters, whereas the booster circuit 18 associated with the third high-voltage reference HV3 usually has plural voltage boosters (4 or 8 in conventional memory devices) connected together in parallel.

The third high-voltage reference HV3 would be active during the verify operations even in conventional memory devices, but its charge would not be transferred to the drain terminals of the affected memory cells by the operations. Thus, the use of all the high-voltage references in parallel would impose no "effort" on the part of the third high-voltage reference HV3.

Furthermore, a demand for additional area on the chip accommodating the memory architecture 15 only comes from the switch blocks SW1, SW2 interconnecting the circuit nodes X1, X2 and X3, with the addition of a few metal levels if the voltage references VPCX, VPCY and VPD are not generated in adjoining areas of the memory device.

It is noteworthy that, for this memory architecture 15 to operate as expected, the voltage boosters used for generating the high-voltage references HV1, HV2 and HV3 should have the same number of stages. In this way, their no-load voltages, as given by:

$$V\text{no-load}=Vdd+n*Vdd,$$

where:

Vdd is the supply voltage to the voltage boosters, and n is the number of voltage boost stages therein, will be identical, allowing the switch blocks SW1 and SW2 to connect these voltage boosters in parallel.

However, this requirement is already met in most conventional flash memory devices, since the values of the references VPCX, VPCY and VPD needed for their operation, and in particular for optimizing the program operations, lie fairly close to one another.

The reduction in the settling time of the voltage references will obviously reflect in a shorter duration of the program verify operations, and especially a shorter duration of the erase operations.

The duration of an operation of erasing a memory sector encompasses a period when the sector to be erased is all programmed by groups of words (the so-called "program all zero"), and a period when the depleted groups are recovered after erasing (which may be called a "light" or "soft" program operation). In particular, these time periods account for a significant proportion of the overall erase operation duration.

Figure 1A:
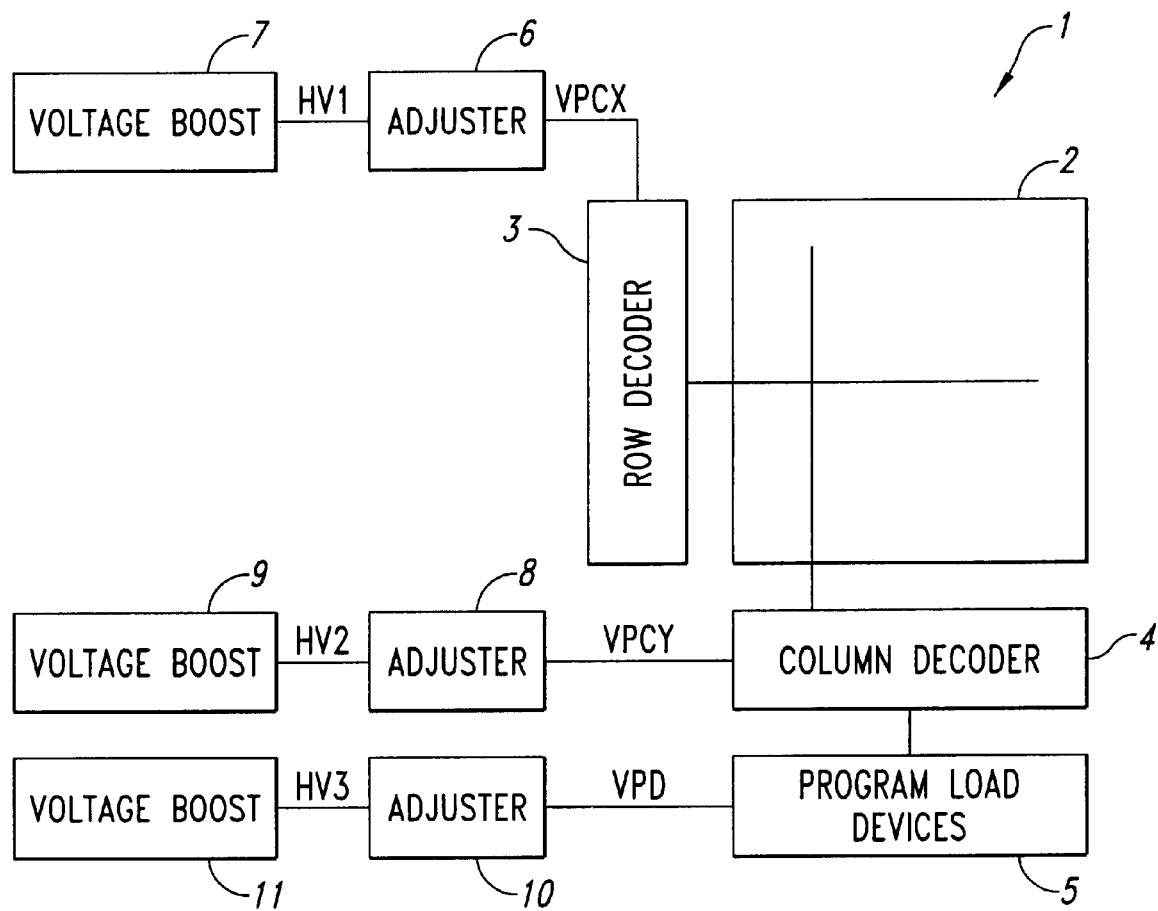
FIG. 1A is a schematic diagram of a memory architecture according to the prior art.
Figure 1B:
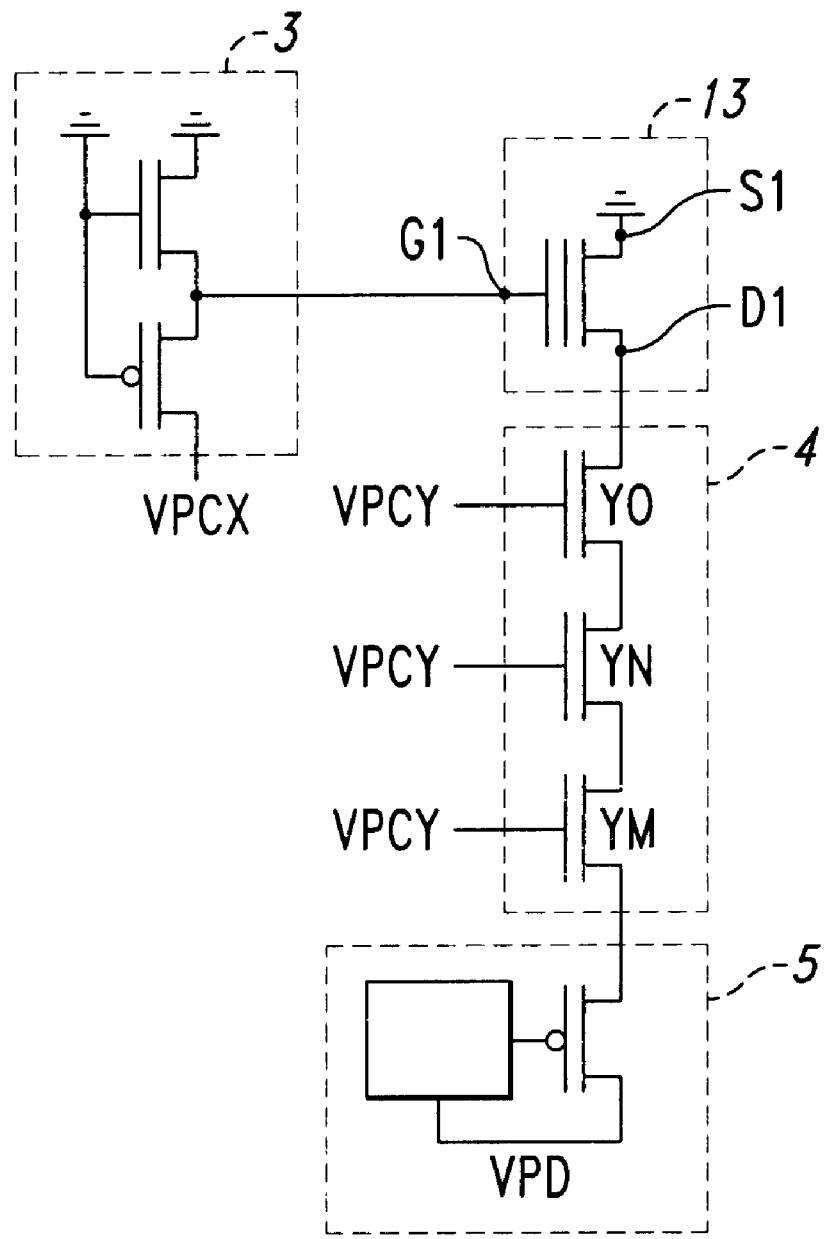
FIG. 1B is a detailed view of the memory architecture shown in FIG. 1A.
Figure 2:
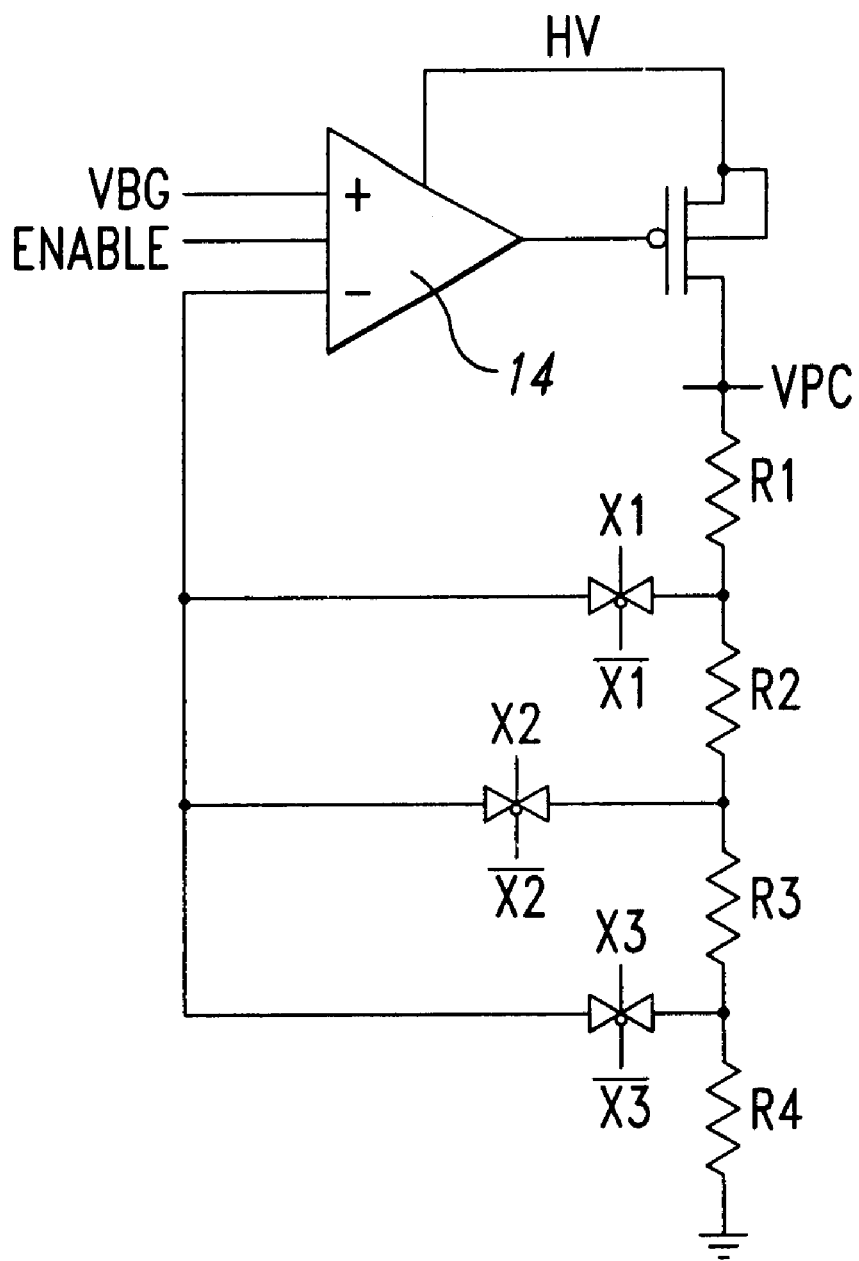
FIG. 2 is a further detailed view of the memory architecture shown in FIG. 1A.
Figure 6:
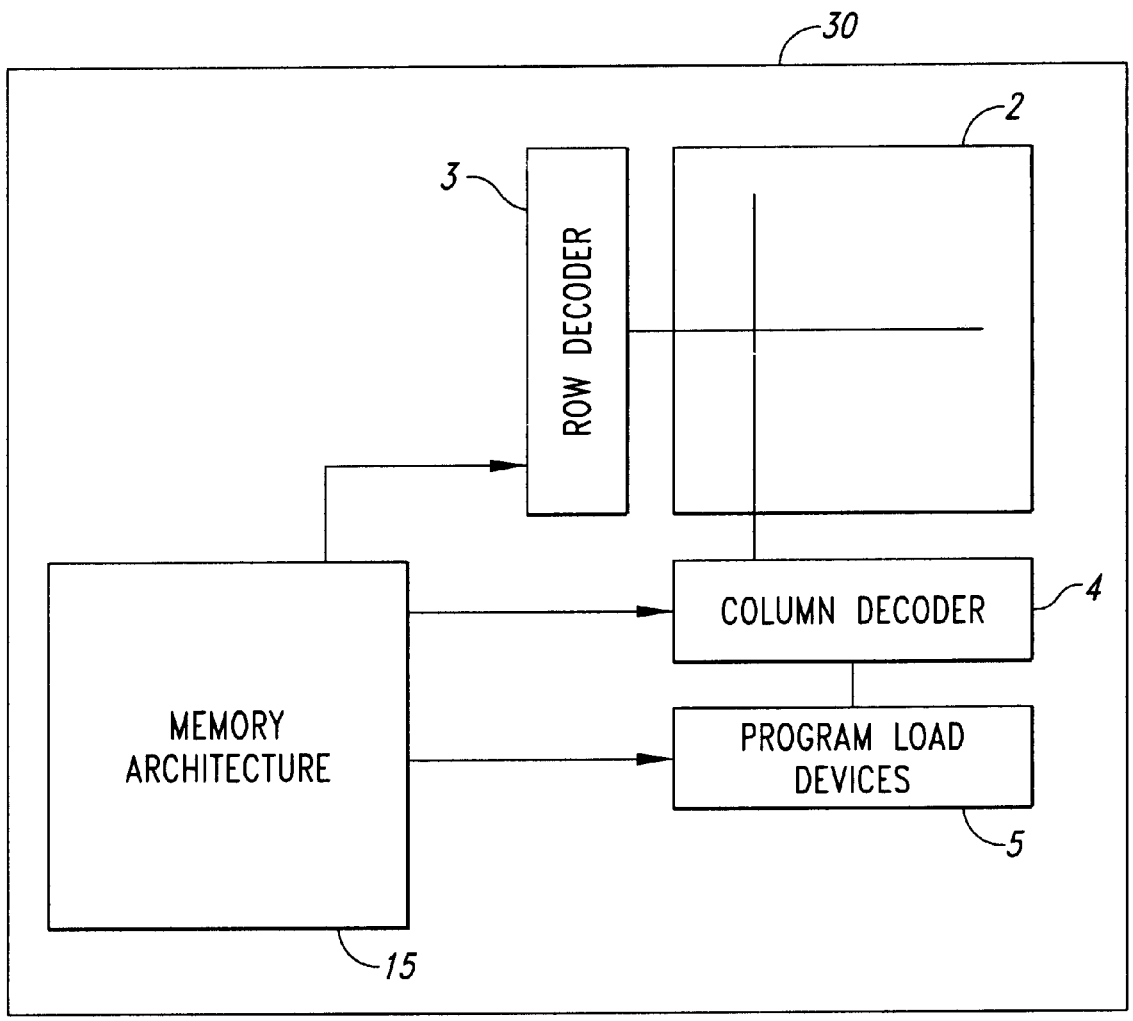
FIG. 6 is a schematic diagram of a flash memory architecture incorporating an embodiment of the invention.

FIG. 6 shows a flash memory 30 incorporating a memory architecture 15 as described with reference to FIG. 4. The flash memory 30, similar to portions of the flash memory 1, the array of cells 2 coupled to both the row decoder 3 and the column decoder 4. Additionally coupled to the array of cells 2 is the program loading devices 5. Differently from the flash memory 1 of FIG. 1A, the flash memory 30 is coupled to the memory architecture 15 that generates first second and third voltages, for instance VPCX, VPCY and VPD that have reduced settling times for use within the flash memory 30.

Figure 5:
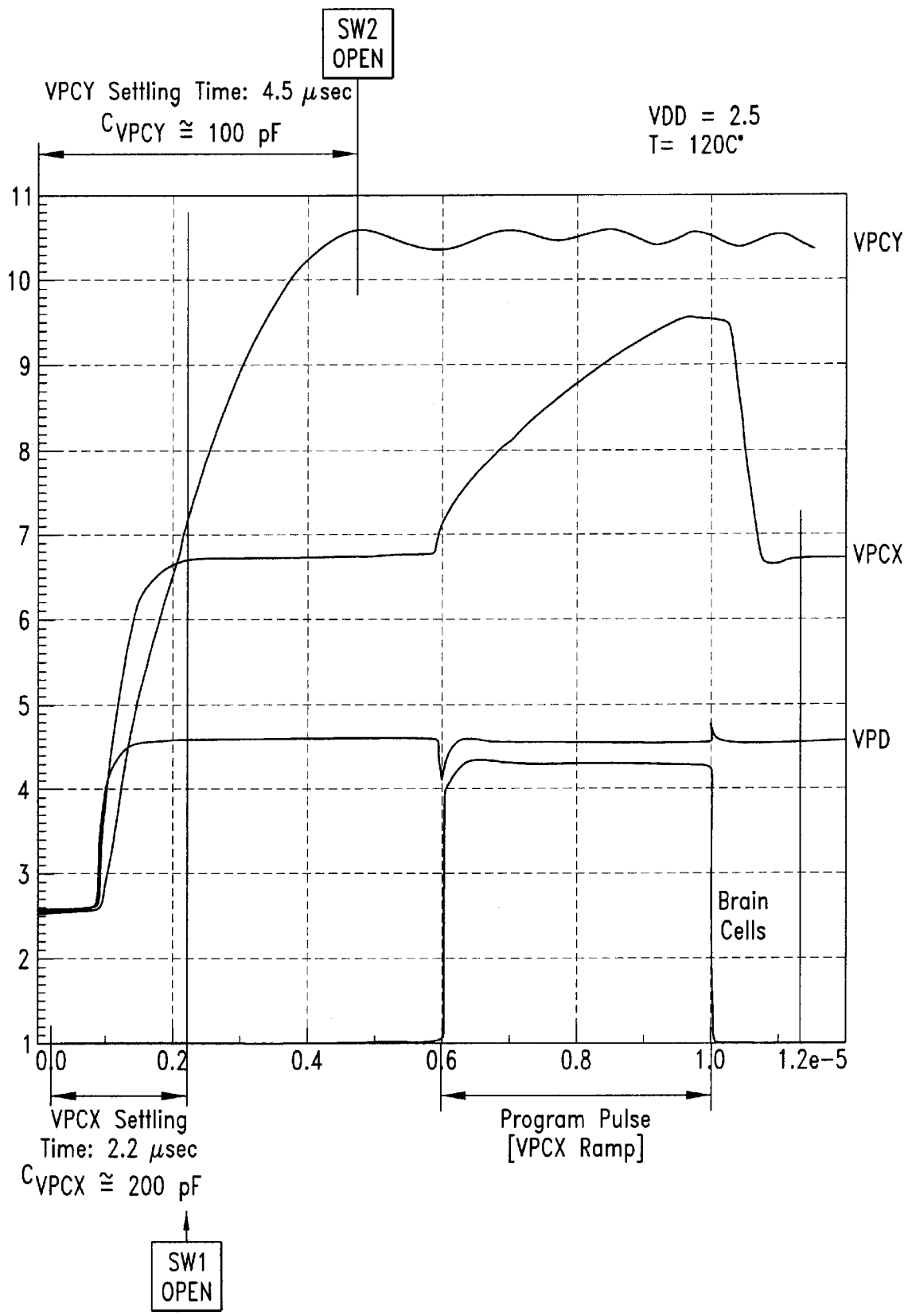
FIG. 5 is a graph that shows qualitative plots of voltage signals present in the memory architecture of FIG. 4 vs. time.

The memory architecture 15 may halve the settling time of the row and column decode references VPCX and VPCY, as shown schematically in FIG. 5. This reduced wait time in operations for programming all the bits of one sector before an actual erase operation (program all zero), or for soft programming any depleted memory cells following the application of erase pulses to a sector (soft program) results in a reduction of up to 10% of the overall erase time, in view of such operations involving, during an erasing step, the scanning of whole memory sectors.

To summarize, this memory architecture 15 is uniquely simple to implement and offers the following advantages: settling times of the row and column decode references, VPCX and VPCY, are shortened by about 50% by virtue of an increased charge current to the corresponding nodes X1 and X2; a shorter time is needed for carrying out an erase operation involving whole memory sectors; there is a "free" use of the third high-voltage reference HV3 during the verify operations, compared to conventional memory devices, with this reference remaining, anyhow, active; no modifications to the microcontroller of the memory architecture are needed for the program and program verify operations, because the microcontroller is inherently capable of setting the control signals CRTL1 and CTRL2 correctly for the switch blocks SW1 and SW2; and only moderately higher integration area requirements are necessary than conventional memory devices.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A memory architecture comprising:

first, second and third voltage booster circuits adapted to generate, on respective first, second and third circuit nodes, first, second and third boosted voltage references, in turn respectively connected to first, second and third adjusters adapted to provide respective first, second and third voltage references as required for the operations of programming, erasing and verifying cells of the memory architecture; and a first switch block connected between the first and third circuit nodes and controlled by a first control signal to place the first and third high-voltage references in parallel during cell verify operations.

2. The memory architecture according to claim 1, further comprising a second switch block connected between the third and second circuit nodes and controlled by a second control signal to place the second and third high-voltage references in parallel during cell verify operations.

3. The memory architecture according to claim 2 wherein the first and second switch blocks comprise respective first and second transistors connected in series with each other between the respective circuit nodes, and having gate terminals connected to respective first and second high voltage switches.

4. The memory architecture according to claim 3 wherein the first and second high voltage switches are connected together and receive the same respective control signal.

5. The memory architecture according to claim 4 wherein the first high voltage switches have respective control terminals connected to source terminals of the first transistors.

6. The memory architecture according to claim 4 wherein the second high voltage switches have respective control terminals connected to drain terminals of the second transistors.

7. The memory architecture according to claim 1, further comprising a microcontroller, and wherein the control signals are set by the microcontroller during program verify operations.

8. The memory architecture according to claim 1 wherein the voltage booster circuits have the same number of stages each.

9. A method of generating voltage references with a reduced value of settling time within a memory architecture, the method comprising:

generating a plurality of boosted voltage references from a plurality of voltage booster circuits;

adjusting the plurality of boosted voltage references by a plurality of adjusters to provide a plurality of voltage references as required for the operations of programming, erasing and verifying cells of the memory architecture; and paralleling at least first and second high-voltage references during at least some of the cell verify operations.

10. The method of generating voltage references according to claim 9, further comprising:

parelleling, with the first high-voltage reference, a further voltage reference during the at least some of the cell verify operations.

11. The method of generating voltage references according to claim 9, wherein paralleling the voltage references are carried out by suitable switch blocks parallel connecting circuit nodes whereat the high-voltage references are produced.

12. A non-volatile memory device having a plurality of sectors of memory cells and having a reduced settling time of row and column decode references, the memory device using the method of generating voltage references according to claim 9 in the operations of programming all the bits of one sector before an erase operation, or soft programming any depleted memory cells following the application of erase pulses to one of the sectors.

13. A memory device including a voltage generating circuit comprising:

a first voltage booster circuit accepting a starting voltage at an input, and having a first high voltage output;

a second voltage booster circuit accepting the starting voltage at an input, and having a second high voltage output;

a third voltage booster circuit accepting the starting voltage at an input, and having a third high voltage output; and coupling circuitry structured to couple at least two of the high voltage outputs together responsive to a control signal.

14. The memory device of claim 13 wherein the coupling circuitry comprises:

a first switch block coupled between the first high voltage output and the second high voltage output, the first switch block controlled by a first control signal; and a second switch block coupled between the second high voltage output and the third high voltage output, the second switch block controlled by a second control signal.

15. The memory device of claim 14 wherein each switch block comprises:

first and second high voltage switches, each having an input coupled to a same one of the respective control signals, and each having first and second outputs;

a first transistor having a first and second conduction terminal and a control terminal, the first conduction terminal coupled to the first output of the first switch, and the control terminal coupled to the second output of the first switch; and a second transistor having a first and second conduction terminal and a control terminal, the first conduction terminal coupled to the first output of the second switch, and the control terminal coupled to the second output of the second switch.

16. The memory device of claim 13 further comprising:

a first voltage adjuster coupled to the first high voltage output and structured to produce a first adjusted voltage for use in the memory device;

a second voltage adjuster coupled to the second high voltage output and structured to produce a second adjusted voltage for use in the memory device; and a third voltage adjuster coupled to the third high voltage output and structured to produce a third adjusted voltage for use in the memory device.

17. A method of generating voltages in a memory device having a first boost circuit with an output for generating a first boosted voltage, a second boost circuit with an output for generating a second boosted voltage, and a third boost circuit with an output for generating a third boosted voltage, the method comprising:

linking the outputs of at least two boost circuits together when a control signal is received, wherein linking the outputs of at least two boost circuits together comprises coupling together the outputs of the at least two boost circuits by way of controlling a first and a second transistor coupled in series between the outputs of the at least two boost circuits.

18. The method of claim 17 wherein linking the outputs of at least two boost circuits together comprises coupling together the outputs of all three of the boost circuits by way of controlling a first and a second transistor coupled in series between the outputs of a first and a second of the at least two boost circuits, and by way of controlling a third and a fourth transistor coupled in series between the outputs of the second and a third of the at least two boost circuits.

19. The method of claim 17 wherein controlling the first, second, third, and fourth transistors occurs during a verify operation of a memory device.

* * * * *